United States Patent [19]

Lefevre et al.

[11] 3,742,489

[45] June 26, 1973

[54] SAMPLE AMPLIFIERS HAVING AUTOMATIC REGULATION OF THE AMPLIFICATION FACTOR BY DISCRETE VALUES

[75] Inventors: George Lefèvre, Nantes; Phillippe Angelle, Thouare, both of France

[73] Assignee: Societe D'Etudes, Recherches et Constructions Electroniques (S.E.R.C.E.L.), Nantes, France

[22] Filed: Oct. 27, 1971

[21] Appl. No.: 192,925

[30] Foreign Application Priority Data

Oct. 29, 1970 France .............................. 7039061

[52] U.S. Cl. ................................ 340/347 AD, 330/1

[51] Int. Cl. ........................................ H03k 13/02

[58] Field of Search .................... 340/347 AD, 15.5; 330/1, 88, 89, 100, 150, 152

[56] References Cited

UNITED STATES PATENTS

| | | | |
|---|---|---|---|
| 3,603,972 | 9/1971 | Vanderford | 340/347 AD |
| 3,562,744 | 2/1971 | Howlette | 340/347 AD |
| 3,467,958 | 9/1969 | McKinney | 340/347 AD |

*Primary Examiner*—Maynard R. Wilbur
*Assistant Examiner*—Jeremiah Glassman
*Attorney*—Alan H. Levine

[57] ABSTRACT

In a sample amplifier having gain variable by discrete value, in which it is desired to bring the samples into a range of specific voltages by means of a suitable amplification factor, two comparators are fed respectively by two reference voltages, and the amplified samples taken successively at different points of the amplification chain are compared to these two reference voltages. A logical decision circuit, associated with a bidirectional counter, allows the "addressed" command of analogue gates connected respectively to the various points of the amplification chain, so as to effect these two comparisons at points determined by the cabled programme of the counter-deducter.

9 Claims, 6 Drawing Figures

SAMPLE AMPLIFIERS HAVING AUTOMATIC REGULATION OF THE AMPLIFICATION FACTOR BY DISCRETE VALUES

The present invention relates to amplifying systems capable of receiving successively samples of electrical signals in the form of analogue input voltages, and which supply on the one hand these analogue voltages amplified so as to display a chosen order of magnitude, and on the other hand logical information representative of the factor of amplification.

The samples are obtained by cutting analogue signals up into sections in time, these signals emanating more often than not from measurement pick-ups. Such a sampling has a double interest, on the one hand for the multiplexing of the analogue signals, on the other hand for the conversion of these analogue signals into numerical signals, in the measurement amplifiers.

The principle of such measurement amplifiers is described in French Patent No. 1,522,367. Their sampled input voltages are brought into the vicinity of the maximum measurement voltage of a numerical analogue converter by means of an amplifying system having automatic regulation of the factor of amplification by discrete values, and the voltages amplified in this way are converted into numerical signals by means of a numerical analogue converter. These numerical signals are associated with the logic signals which express the amplification factor, for example on a recording support.

In known realisations of amplifying systems of this kind, a plurality of amplifying stages of known identical gain are used, constituting an amplification chain. This amplification chain comprises succcessive points: the input of the first amplifier, each of the connections from one amplifier to the next, and the output of the last amplifier. These points of the amplification chain, arranged in that order, have voltages of an amplitude increasing according to a geometrical progression of which the ratio is the gain of one amplifying stage.

The automatic regulation of the amplification factor is effected by choice of the point of the amplification chain at which the voltage is suitable, that is to say generally the nearest one by lower values to an admissible maximum value. This choice is effected by controlled commutation of analogue gates each connected to one of the various points of the amplification chain. These gates are therefore used in a number equal to that of the amplification stages increased by one unit.

In order to obtain the point of the amplification chain where the magnitude of the voltage is suitable for use, known amplifiers compare with a reference voltage, simultaneously or successively, the voltages appearing at the various points of the amplification chain. A logical decision circuit receives the result of these comparisons and chooses to actuate the analogue gate corresponding to the point of the amplification chain which has an optimum voltage, or optimum point.

A first family of known devices realises this comparison in a simultaneous manner. The amplifiers of this family comprise a comparator for each analogue gate. The comparison is effected simultaneously at the level of each comparator for the whole of the points of the amplification chain. The result of these simultaneous comparisons is transmitted to the logical decision circuit which determines the optimum point of the amplification chain.

In the case of an admissible maximum value, the optimum point is the point which is most remote from the start of the amplification chain amongst those which deliver a voltage lower than the reference voltage, this reference voltage being fixed at a value slightly less than the aforesaid admissible maximum value.

This device is of rapid operation but comprises a large number of comparators. When the value of the input voltages of the amplification chain is capable of large variations, the number of comparators necessary in order to have good precision of measurements rapidly become prohibitive since it increases with the number of points of the amplification chain.

A second family of known devices effects the comparison with a reference voltage successively for each point of the amplification chain, in the order of the increasing voltages or, preferably, decreasing ones. This amplifier comprises a single comparator, which is connected successively to the various points of the amplification chain, and a reference voltage. This connection starts preferably by the output of the final stage, going back as far as the input of the first stage. As soon as the result of the comparison changes, the point of comparison is the suitable point. This method necessitates on an average a number of successive decisions equal to half the number of points of the amplification chain. Since these decisions take a certain time, one uses a single comparator to the detriment of the duration of seeking the point having an optimum signal.

For the elaborated measurement amplifiers capable of receiving analogue signals whose amplitude varies between wide limits, none of these two devices therefore gives complete satisfaction.

The present invention proposes a sample amplifying system having automatic regulation of the amplification factor by discrete values, more especially applicable for the amplification with a view to analogue to digital conversion, and which does not have these disadvantages. This amplifier effects the selection of the point having the optimum signal after a minimum of commutations.

In accordance with an essential feature of the device in accordance with the invention, the analogue gates connected to the various points of the amplification chain have their output connected by an electrical line and this electrical line supplies one of the comparison inputs of two comparators, the other comparison input of which is connected to a different reference voltage for each of the two comparators. These two reference voltages are chosen in a ratio close to the gain of one amplifier of the chain.

The comparison of the voltage present at a chosen point of the amplification chain with these two reference values supplies two bits of logical information. The whole of these two items of information corresponds to the position of the voltage present at the chosen point in relation to the interval constituted by the two comparison voltages. If the voltage at the chosen point is within this interval, it is the optimum voltage. If it is geater than the comparison voltage, the optimum point is situated amonst the points having a lower voltage. If the voltage at the chosen point is less than the lower comparison voltage, the optimum point is situated amongst the points having a higher voltage.

In accordance with another feature of the device in accordance with the invention, these two simultaneous comparisons are made first of all for a chosen point of the amplification chain which comprises on either side an equal number of other points to one unit (such a point will be called hereinafter a middle point of a whole of points of the comparison chain). The result of this first comparison is transmitted to a logical control and decision circuit which determines the assembly of points of the chain in which the optimum point is to be found. A second comparison is made with a middle point of this assembly of points which contains the optimum point. These operations are continued one obtains the optimum point alone after a final comparison.

It is necessary to note that, according to the position of the optimum point, the theoretical number of operations varies if the comparisons are halted upon the determination of a set containing the sole optimum point. On the other hand, the various successive comparisons are included in a diagram predetermined by the number of amplifiers of the chain as well as the logical control and decision circuit.

In accordance with a preferred variant of the device of the invention, this logic effects the comparisons and the decisions for a number of times sufficient to arrive at a single set containing the sole optimum point, whatever this optimum point may be. This finds expression in the fact that one will be led in certain cases to repeat a comparison on one and the same chosen point, as will be seen later on.

Other features and advantages of the invention will emerge when reading the following description, made with reference to the attached drawings, given by way of non-restrictive examples, and in which.

Figure 1:
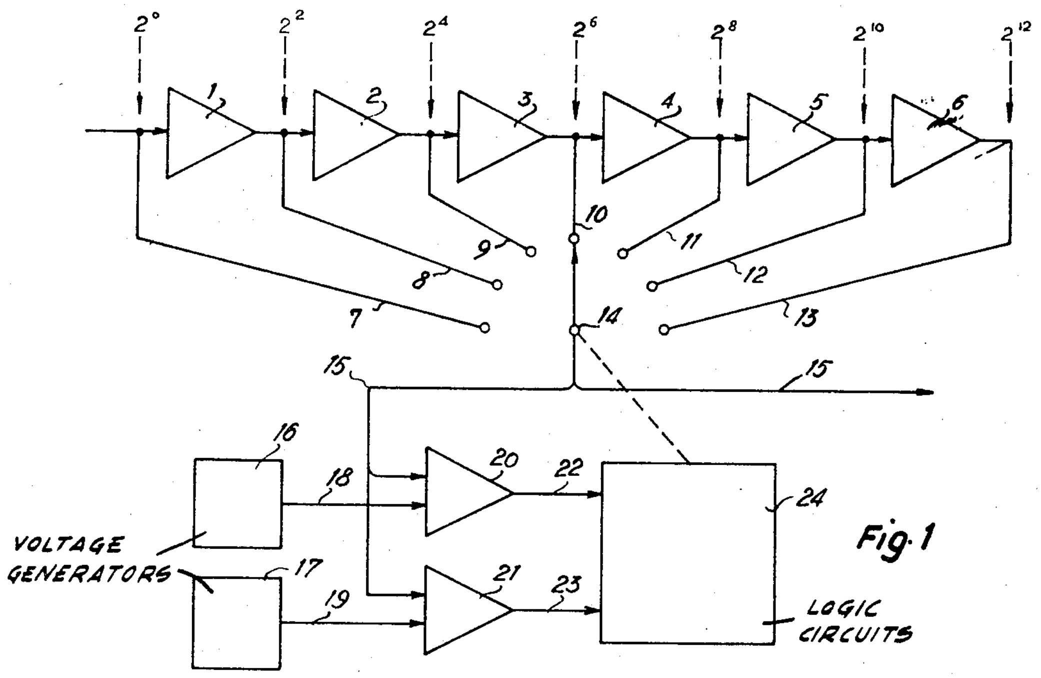
FIG. 1 is a diagrammatic representation illustrating the implementation of the procedure in accordance with the invention for an amplification chain comprising six amplifiers of gain equal to $2^2$.

Shown in FIG. 1 is an amplification chain comprising six amplifiers 1 to 6 of a gain equal to $2^2$. This amplification chain comprises a number of points, that is to say inputs and/or outputs of amplifiers equal to the number of amplifiers increased by one unit, in other words seven. These points are designated in FIG. 1 by the amplification factor which they represent in relation to the input of the amplification chain. The seven points therefore bear the successive references $2^0$ to $2^{12}$. They are connected to electrical connections designated by the references 7 to 13. In FIG. 1, these connections lead to a commutator switch having a mobile connection 14 capable of being connected in a controlled manner to any one of the connections 7 to 13. This commutator is a diagrammatic representation of an assembly of analogue gates connecting the connections 7 to 13 to the connection 14, in the case where a single one of these gates can be unblocked at one and the same time. The connection 14 is connected to a line 15 which supplies on the one hand the output of the amplification chain, and which, on the other hand, is connected to the selection members of the amplifier having variable gain.

These selection members comprise two generators of reference voltages 16 and 17, these two voltages being in a relationship equal to the gain of one of the amplifiers 1 to 6. The generators of reference voltages 16 and 17 are connected respectively by lines 18 and 19 to comparators 20 and 21, which also both receive, through the line 15, a voltage taken from one of the points of the amplification chain. The respective outputs 22 and 23 of the comparators 20 and 21 are applied to a control and decision logic 24. According to the state of the outputs of the comparators 20 and 21, this logic 24 controls, through the medium of the commutator 14, the electrical connection of the line 15 successively to specific points of the amplification chain, so as to realise the selection of the optimum point of the amplification chain by means of a minimum number of commutations.

This control is effected by choice of the control and decision logic from a certain number of possibilities of commutation materialised by means of pre-established connections of this logic. A preferred example of the operating diagram of the logic 24 is shown in FIG. 2.

The logic 24 commands first of all the comparison of the signal present at the point $2^6$ of FIG. 1 in the two comparators 20 and 21, in relation to the reference voltages supplied by the generators 16 and 17. It will be admitted that the output of such a comparator is a "logical 1" when the voltage present on the line 15 is greater than a reference voltage, and a "logical 0" when the voltage present on the line 15 is less than a reference voltage. In this case, when the voltage present on the line 15 is greater than the two reference voltages, the result of a comparison is 11. When the voltage present on the line 15 is comprised in the interval of the two reference voltages, the result of the comparison is 01. When this voltage is less than the two reference voltages, the result of a comparison is 00. Amongst these results, the comparison state 11 corresponds to the need for a decrease in gain; the state 01 signifies that the gain applied is suitable for the instantaneous signal present on the line 15, and the state 00 corresponds to the need for an increase in the gain.

Figure 2:
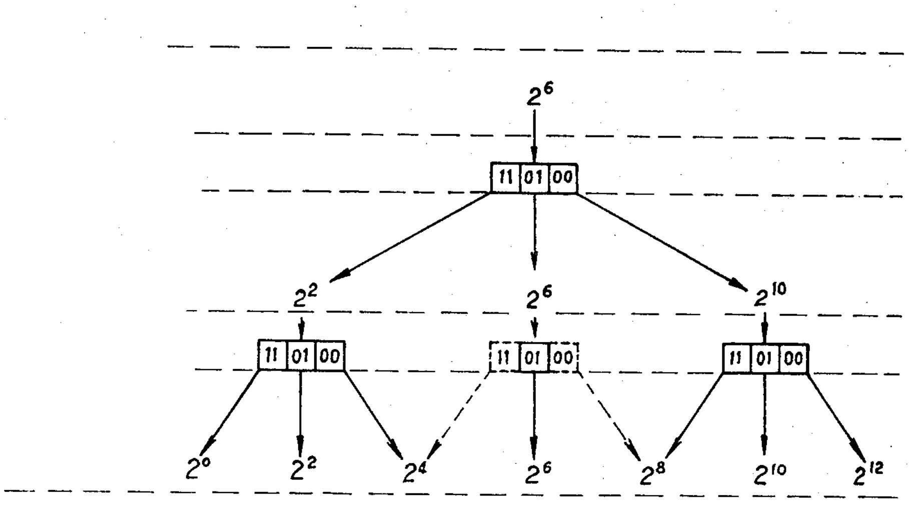
FIG. 2 is a diagram representing the various possible evolutions upon the implementation of the procedure in the case of the amplification chain of FIG. 1.

In FIG. 2, the initialisation corresponds to the choice of the middle point 26 of the chain for a first comparison. When the result of this comparison is 11, the logic 24 commands by means of a first decision a second comparison for the point $2^2$. When the result of the first comparison is 01, the first decision commands a second comparison for the same point $2^6$. When the result of the first comparison is 00, the first decision brings to pass a second comparison for the point $2^{10}$.

After this second comparison, a second decision of the logic 24 allows the exact determination of the optimum point of the amplification chain as indicated. This optimum point is then connected to the line 15, towards the output of the amplification chain.

A precise example allows better comprehension of the operation of the logic 24 : the point $2^4$ of the chain shown in FIG. 1 has a voltage of 6 volts, and the two comparison voltages are respectively 2 and 8 volts. The initialisation is effected for the point $2^6$. The result of the first comparison is 11, the first decision corresponds to the connection of the commutator 14 to the line 8 connected to the point $2^2$ (FIG. 1). The second comparison has, as its result, 00, and the second decision corresponds to the connection of the commutator 14 to the line 9 connected to the point $2^4$. The control logic then supplies on the line 15 the voltage corresponding to the optimum point. An impulse supplied by this logic or by a general control logic (not shown in FIG. 1) indicates that the voltage present on the line 15 is indeed the voltage corresponding to the optimum point, that is to say in fact that the process of selection of the optimum point is concluded.

In FIG. 2 there are also shown, for the second comparison effected on the point $2^6$, the results 11 and 00. These results are theoretically impossible to obtain, except if the signal applied to the amplification chain is subject to very rapid variations. They therefore correspond to cases possible in reality at the output of the comparators 20 or 21, and the logic 24 responds to possible cases as is indicated in FIG. 2.

By considering FIG. 2, it can be seen that the diagram of the logical possibilities which is shown covers, after two comparisons and two decisions, a number of final decision equal to seven. In the general case, a number of $x$ decisions allows one to choose a maximum number $y$ of points of an amplification chain given by the formula:

$$y = 2^{x+1} - 1$$

This number is also the number of amplification factors available at a time when the number of amplifiers is:

$$2^{x+1} - 2$$

Figure 3:
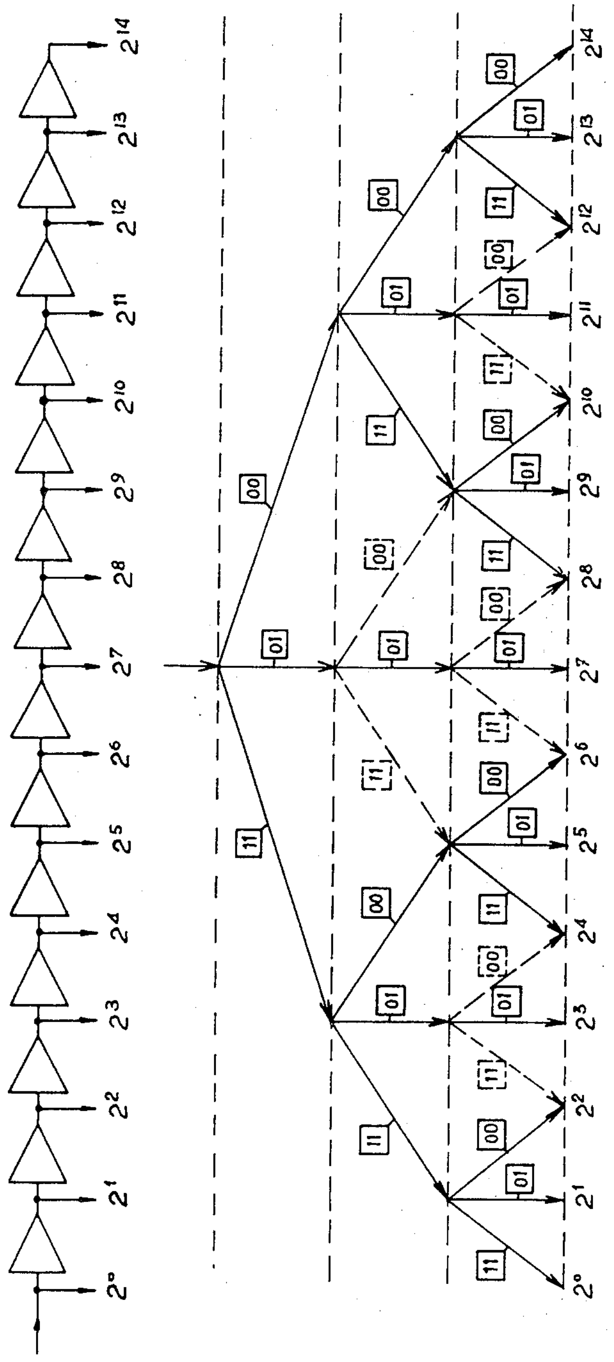
FIG. 3 is a similar diagram in the case of an amplification chain comprising 14 amplifiers of a gain equal to 2.

Represented in FIG. 3 is a diagram of the various possibilities of the decision in the case of an amplification chain comprising 14 amplifiers, that is to say 15 values of the amplification factor. The points of the amplification chain are represented by the gain which they procure, in the same way as in FIG. 1, the gain of one of the amplifiers of the chain being 2. The associated logical diagram is shown as that of FIG. 2, the impossible theoretical cases but which can be encountered for signals having very rapid variation are represented in dotted lines.

The logical diagrams which have been considered so far correspond to the cases where the number of values of the amplification factor which it is desired to handle is strictly equal to $2^{x+1} - 1$. In this case, the successive decisions apply strictly to the middle point of the subassemblies determined after each comparison in the amplification chain. It stands to reason that, in practice, this case is not always realised. The generalisation of the process is easy for a man of the art. In fact, when there is no middle point strictly speaking, one takes the immediately adjacent point of slightly greater or slightly lesser amplification factor. This corresponds to the definition of the middle point of an amplifying assembly such as has been given above.

Despite the slight redundancy introduced in the case which has just been envisaged, the device in accordance with the invention remains the most rapid amongst those which use a limited number of comparators. On the other hand, by increasing the number of cases possible upon a signal having very rapid variation, this redundancy can be used so as to widen the scope of employment of the device in accordance with the invention. By scope of employment one understands the dynamics and the frequency band for which the sample amplifier is used.

Figure 4:
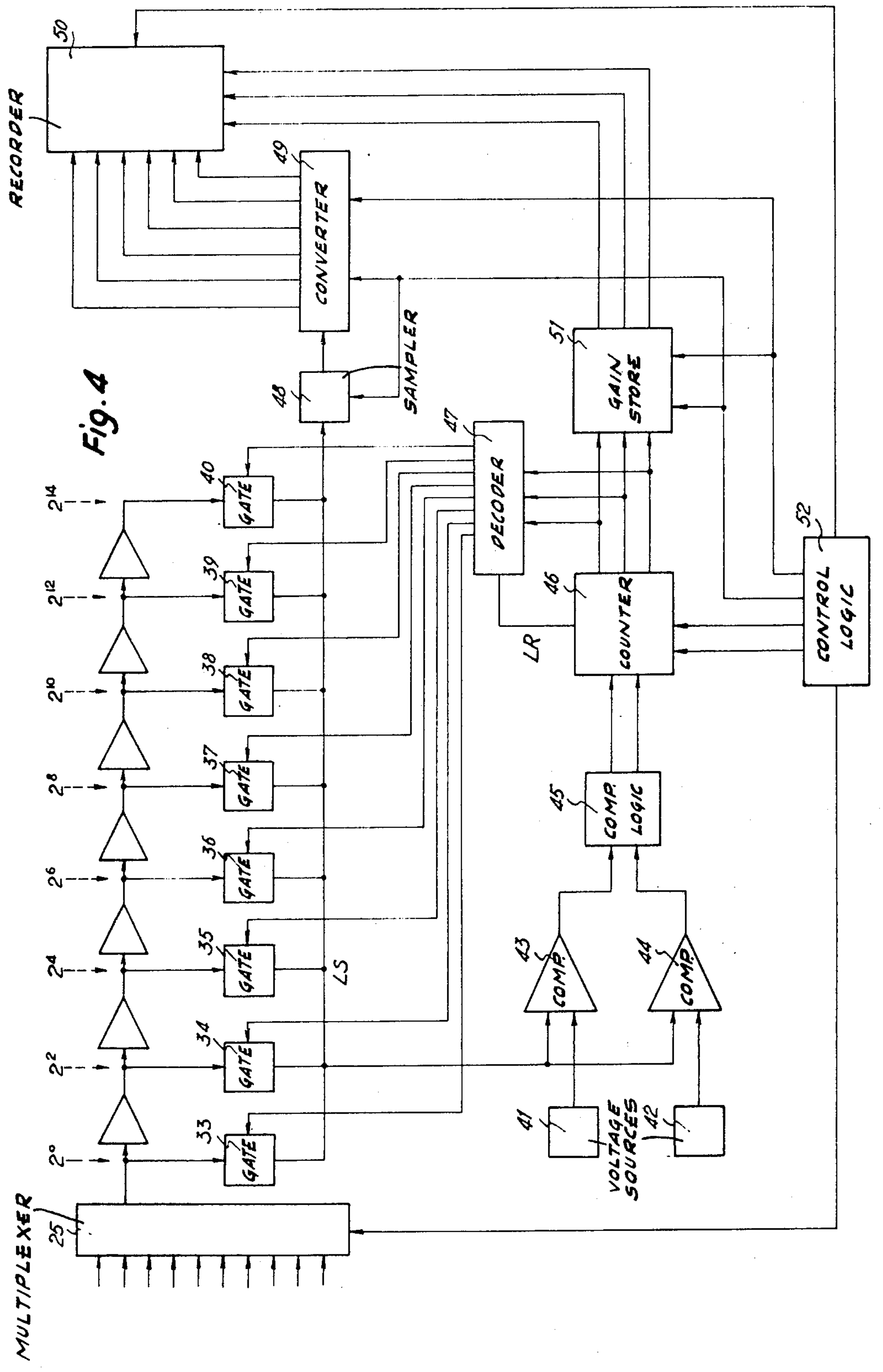
FIG. 4 is a diagram of the sample amplifying device having variable gain in accordance with the invention, associated with a numerical analogue converter and a magnetic recorder, the numerical output signals being supplied in binary notation.

FIG. 4 shows the complete electrical diagram of a sample amplifier having automatic regulation of the amplification factor by discrete values comprising seven amplifying stages, and associated with an analogue to digital converter whose numerical output information is supplied for each sample to a recorder, at the same time as the amplification factor used by the amplification chain.

The input voltages are supplied in the form of samples by a multiplexer 25 possessing a plurality of inputs connected for example to pick-ups (not shown), and whose output is connected to the input of the amplification chain constituted by seven amplifiers 26 to 32, of gain equal to $2^2$. The points of this amplification chain are shown by means of their amplification factors in relation to the input which are therefore in this case $2^0$ to $2^{14}$. These points, eight in number, are connected respectively to controlled analogue gates 33 to 40. The outputs of these analogue gates are all connected by a line LS.

The amplifier comprises on the other hand two generators 41 and 42 of reference voltages, respectively equal to 2 and 8 volts, and connected respectively to one comparison input of two comparators 43 and 44. The other comparison input of each of the comparators 43 and 44 is connected to the aforesaid line LS. The outputs of the comparators 43 and 44 are connected to the decision logic which, following the result of these two comparisons, decides on the maintenance or the modification of the state of a programmed counter-deducter 46. The counting of this programmed counter-deducter 46 constitutes an addressing of one of the analogue gates 33 to 40. It also corresponds to a counting of the rank of the points of the amplification chain, and consequently of the amplification factor. As address, it is decoded by a decoding circuit of the addresses 47 connected by its inputs to the outputs of the programmed counter-deducter 46, and by each of its outputs to one of the analogue gates 33 to 40. The decoding circuit 47, which controls the state of the gates 33 to 40, is connected in turn to the counter-deducter 46 by a plurality of lines LR, by means of which the said counter deducter 46 is informed of the state of the gates 34 to 39.

The line LS already mentioned, which takes the place of a common output line for the analogue gates 33 to 40, is connected to a sampler-blocker 48 capable of storing in a controlled manner the voltage present on the line LS. To the output of this sampler 48 there is connected an analogue to digital converter 49 which has, on a plurality of outputs, numerical signals corresponding to its analogue input voltage. These numerical signals are applied to a recorder on magnetic tape 50.

These numerical signals are in fact a measure of the input signal of the amplification chain multipled by the optimum amplification factor, that is to say that which brings it into a range of voltages such that the measurement by the numerical analogue converter is effected with the best precision. The amplification factor represented by the state of the programmed counter-deducter 46 is stored after the selection of the optimum point in a store 51 connected to the said programmed counter-deducter 46. This store 51 supplies on a plurality of output lines the value of the amplification factor which is recorded in controlled manner by the recorder 50, at the same time as the result of the measurement, by the converter 49, associated with the same sample. The operation in time of the whole of the system is effected under the control of a control logic connected to the multiplexer 25, to the programmed counter-deducter 46, to the sample-blocker 48, to the numerical analogue converter 49, to the recorder 50 and to the store 51.

Figure 5:
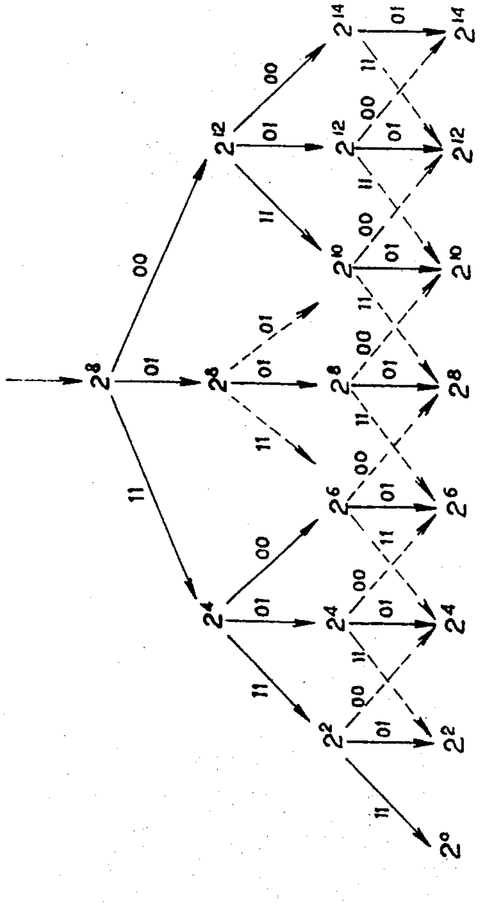
FIG. 5 is a diagram similar to that of FIG. 2 in the case of an amplification chain comprising seven amplifiers of a gain equal to $2^2$.

The selection of the optimum point of the amplification chain of FIG. 4 is made according to the logical diagram shown in FIG. 5 and by means of three decisions. This operation will now be considered in the case of the realisation of FIG. 5, taking into account the passage of time.

The multiplexer 25 supplies 30 samples per millisecond. The interval of time which separates two samples is therefore 33 microseconds. As soon as a sample appears at the output of the multiplexer 25, an order emanating from the control logic 52 effects the positioning of the counter-deducter 46 so as to ensure the unblocking of the gate 37. This realises an initialisation by selection of the amplification factor $2^8$ (FIG. 5). The comparators 43 and 44 supply at once the result of the comparison. The logical decision circuit 45 then decides, according to the result of this comparison, on the deducting, that is to say the decrease in the gain, the maintenance in the state, or the counting, that is to say the increase in the gain. This decision is transmitted to the counter-deducter 46.

Three microseconds after the start of the sample, the logical control circuit 52 applies to the counter 46 a first impulse of change in gain. According to the instructions of the decision logic 45, it passes into one of the following three states:

if the result of the comparison is 11, unblocking of the sole analogue gate 35;

if the result of the comparison is 01, unblocking of the sole analogue gate 37 (that is to say maintenance in the state);

if the result of the comparison is 00, unblocking of the sole analogue gate 39.

These three states correspond respectively to the gains $2^4$, $2^8$, $2^{12}$ shown in FIG. 5 facing the first decision.

Six microseconds after the start of the sample, the logical control circuit 52 applies to the counter 46 a second gain change impulse, which supplies a second series of items of comparison information to the decision logic 45 as is shown in FIG. 5 and brings to pass a second decision.

Nine microseconds after the start of the sample, a third gain change impulse gives rise to a third decision which allows the exact determination of the optimum point of the amplification chain as is shown in FIG. 5.

Several microseconds after the third gain change impulse, the control logic 52 orders the storing of the voltage present on the line LS by the sampler-blocker 48, as well as the storing of the amplification factor by the logical store 51, and, a very short time after, the conversion of the voltage stored in the sampler 48 by the converter 49.

A final order of the logical control circuit 52, applied simultaneously to the converter 49, to the recorder 50 and to the store 51, commands the recording by the said recorder 50 of the magnitude of the amplified sample, supplied by the converter 49, and of the value of the amplification factor supplied by the store 51.

The sampler-blocker 48 and the store 51 both allow the storing of the items of information supplied by the sample amplifier having variable gain, proper. It follows that this latter can commence the treatment of the following sample whilst the converter 49 is effecting the numerical analogue conversion.

The general operation such as it has been summed up above is broadly comprised in the interval of time of 33 microseconds which separates two samples.

The schematic diagram shown in FIG. 5 has continuous lines which correspond to the diagrams of the various possibilities when the input signal applied to the amplification chain is constant. If this signal is capable of big variations, it is also necessary to take into consideration the possibilities shown in dotted lines. At the level of the third decision, there therefore appears a considerable number of redundancies which render more reliable the strict determination of the optimum amplification factor if the voltages delivered by the multiplexer are capable of rapid variations.

There will now be described, with reference to FIG. 6, the detailed circuits which constitute the decision logic 45, the programmed counter-deducter 46, the decoding circuits for the addresses 47, and the store 51.

Figure 6:
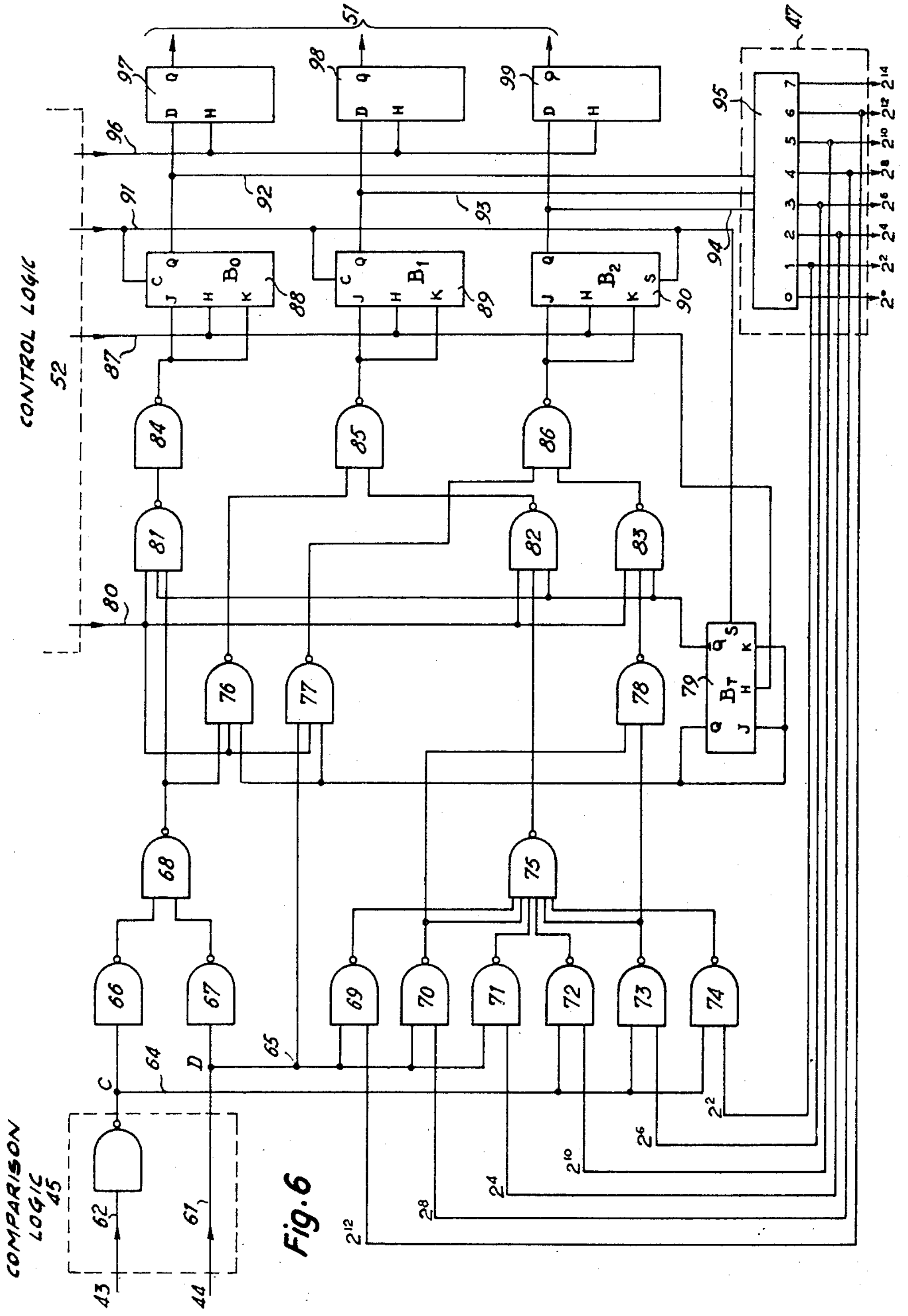
FIG. 6 shows the detailed electrical diagram of the elements 45, 46, 47 and 51 of FIG. 4.

FIG. 6 comprises two input lines 61 and 62 each connected to one of the comparators 43 and 44 of FIG. 4. It will be assumed arbitrarily that the line 61 is associated with the comparator whose reference voltage is the greatest, and that the line 62 is associated with the comparator whose reference voltage is the smallest. These two comparators have on their output identical items of information when they effect an overstepping by greater values. Consequently, the line 62, connected to the output of the comparator 43 (minimum), is first of all connected to an inverter 63 so as to supply an excitation upon an overstepping by lower values. This inverter is constituted by an AND-NOT logical operator shown conventionally in FIG. 6. This assembly constitutes the decision logic 45 already mentioned, and its outputs bear the references C and D, connected respectively to the lines 64 and 65. The output C, when it is excited, corresponds to the counting, the output D, when it is excited, corresponds to the deducting.

FIG. 6 comprises in all 20 logical AND-NOT operators of the same type as the operator 63. Such operators can operate as an inverter with a single input, or else be sensitive to the state of a plurality of inputs, their output being 0, when all their inputs are 1.

FIG. 6 also comprises a bistable $B_T$ intended to differentiate the first decision from the other two. It can be seen in FIG. 5 that the first decision brings to pass a variation of the amplification factor of two units, whilst the others bring to pass a variation of only one unit. The rocker $B_T$ comprises two preconditioning inputs J and K, an input H on which there is applied the command of the instant of change of state which is made in accordance with the preconditioning of the inputs J and K to the state 1. It comprises two outputs Q and $\bar{Q}$, the output $\bar{Q}$ being the complement of the output Q. It finally comprises two inputs S and C (not shown) which allow the forced positioning of the output Q in the states 1 and 0 respectively.

This Figure also comprises three bistables 88, 89 and 90 ($B_0$, $B_1$, $B_2$ respectively), of the same type as the bistable $B_T$ whose levels of logical output Q represent the gain code in the form of a binary number having three digits, of respective weights 0, 1 and 2 for the bistables $B_0$, $B_1$ and $B_2$. The three output lines of these three bistables respectively are transmitted to the blocks 47 and 51 of FIG. 4, which are now detailed in this FIG. 6.

The block 47 is constituted by a binary decimal transcoder 95 comprising seven utilisation outputs numbered respectively from 0 to 7 and each connected to one of the analogue gates 33 to 40 respectively. This transcoder receives through the lines 92, 93 and 94, on three inputs, the state of the outputs of the bistables 88, 89 and 90 which represent the gain code, and commands the unblocking of one of the gates of gain $2^0$ to $2^{14}$.

These same lines 92 to 94 are also connected to three rockers 97, 98 and 99 which store the gain code and form the block 51 of FIG. 4. (one will now employ in an equivalent manner the expressions "gain" and "amplification factor)".

FIG. 6 also comprises four output lines of the logical control block 52, the lines 80, 87, 91 and 96. The line 80 is actiated in a manner which straddles the impulses of chain in gain. It passes from the state 0 which is its normal state, to the state 1 at an instant situated 0.25 microseconds before the start of each gain change impulse, and reverts to the level 0, at an instant situated 0.25 microseconds after the end of the same gain change impulse. The said gain change impulses are instantaneous passages from the level 0 to the logical level 1, of a duration of 0.5 microseconds. These impulses are supplied by the line 87. The line 91 realises the initialisation of the amplification factor, as will be seen later on. The line 96 orders on the input H of the rockers 97 to 99, the transmission of the determined optimum amplification factor of the block 51 towards the records 50 of FIG. 4.

The general operation of the logical device shown in FIG. 6 will now be described with reference to the logical diagram of FIG. 6 and to the aforegoing description.

The initialisation occurs upon the appearance of an impulse on the line 91. This impulse is transmitted to the inputs C for forced positioning in the state 0 of the bistables $B_0$ and $B_1$ respectively, and to the input S for forced positioning in the state 1 of the rocker $B_2$. Consequently, the number obtained in this way will be 100, which corresponds to the gain $2^8$ (it will be recalled that 8 in decimal notation is written 100 in binary notation).

This same initialisation impulse present on the line 91 is applied to an input for forced positioning into the state 1 of a bistable $B_T$ (reference 79). This bistable $B_T$ is a store which records the presence of an initialisation signal. To this end, its non-complemented output Q is connected to its preconditioning inputs J and K, which are therefore in the state 1 at the same time as Q, under the action of the initialisation impulse supplied on the input S by the line 91. This bistable changes state once only upon the application of the first gain change impulse via the line 87 to its input H for command of actuation, the states of the inputs J and K both being 1.

The gain change impulses are applied to the actuation inputs H of the bistable $B_0$, $B_1$, $B_2$ and $B_T$ via the line 87. It has already been said that they are "straddled" by impulses supplied on the line 80. The object of these impulses is to prepare the state of the counter-deducter before each change in gain commanded by an impulse on the line 91.

The preconditioning inputs J and K of the rockers $B_0$, $B_1$ and $B_2$ are commanded respectively by the AND-NOT operators having the references 84, 85 and 86.

As has been said above, just before the first gain change impulse, the line 80 applies a signal 1 to the operators 76, 77, 81, 82 and 83. At the same time the rocker $B_t$ applies a signal 1 to the operators 76 and 77 through its output Q, and a signal 0 to the operators 81, 82 and 83 through its output $\bar{Q}$. These two operators 76 and 77 are therefore sensitive to the state of their final input. For the operator 76 this final input is connected to the output of the operator 68, which forms with the operators 66 and 67 a non-exclusive OR-connection in known 'per se' manner. The result is that the operator 76 will have its output in the state 0 if C or D are in the state 1. The result is, through the medium of the operators 76 and 85, a rocking of the rocker $B_1$.

The operator 77 is sensitive to the state of the line 65, that is to say of the deducting line D, and commands, through the medium of the operators 77 and 86, the rocking of the rocker $B_2$.

The initialised state of the rockers $B_0$, $B_1$, $B_2$ is 100 ($2^8$). The result is, according to the state of the lines C and D, logical possibilities expressed by the following table, which are indeed those of the first decision of FIG. 5.

| Comparison C | Comparison D | Decision C | Decision D | $B_2$ | $B_1$ | $B_0$ | Gain |
|---|---|---|---|---|---|---|---|
| 0 | 0 | 1 | 0 | 1 | 1 | 0 | $2^{12}$ |
| 1 | 0 | 0 | 0 | 1 | 0 | 0 | $2^8$ |
| 1 | 1 | 0 | 1 | 0 | 1 | 0 | $2^4$ |

These changes in state take effect at the instant of the first gain change impulse present on the line 87. The result is also the rocking of the rocker $B_T$.

The operators 76 and 77 then see their output pass compulsorily to the state 1. The operators 81 and 83 have one of their inputs in the state 1 through the line connected to the complemented output of the rocker $B_T$. The result is that the preconditioning inputs of the rockers $B_0$, $B_1$ and $B_2$ are in a state which is fixed by the state of the outputs of the operators 81, 82 and 83 respectively. Just before the second gain change impulse, the second input, connected to the line 80, of the operators 81 to 83 passes to the state 1.

The operator 81, connected to the output of the operator 68, therefore receives the logical function C or D. The operator 83 sees its output in the state 0 in controlled manner by the operators 78 and 70 and 73. The output of the operator 78 is in the state 1 when either the operator 70, or the operator 73 is in the state 0, that is to say either when the gain is $2^8$ (code 100) and when it is necessary to deduct (line D), or when the gain is $2^6$ (code 11) and it is necessary to add (line C). It can be seen that it is a question of determining the logical state of the code of highest weight in the rocker $B_2$.

The operator 82 sees its final input pass to the state 1 when one of the inputs of the operator 75 is in the state 0, that is to say again when the two inputs of one of the operators 69 to 74 are in the state 1. When this final condition is realised, the rocker $B_1$ changes state.

Upon the second and third gain change impulses, the gain can change only by one unit in binary coding. The result is that the rocker $B_0$ changes state if the decision logic 45 commands either the counting, or the deducting. It is this function which has been brought to light previously.

It has also been written that the rocker $B_1$ is sensitive to the simultaneous excitation of the two inputs of one of the operators 69 to 74. It can easily be verified that each of these operators supplies the positive or negative carry-over according to whether one is effecting the counting or the deducting upon the variation by one unit already mentioned for the digit of zero binary weight (rocker $B_0$).

The rocker $B_2$ effects the same operation, but the carry-over occurs on the digit of binary weight 2 (rocker $B_2$). This carry-over operation has been described above in the form of logical function.

The following table expresses the state of the rockers $B_0$, $B_1$ and $B_2$ for the various values of the gain; as from these states there are effected possible carry-overs.

| Gain | $B_2$ | $B_1$ | $B_0$ |
|---|---|---|---|
| $2^i$ | | | |
| $2^{14}$ | 1 | 1 | 1 |
| $2^{12}$ | 1 | 1 | 0 |
| $2^{10}$ | 1 | 0 | 1 |
| $2^8$ | 1 | 0 | 0 |
| $2^6$ | 0 | 1 | 1 |
| $2^4$ | 0 | 1 | 0 |
| $2^2$ | 0 | 0 | 1 |
| $2^0$ | 0 | 0 | 0 |

For the changes in state occurring upon the second and third gain change impulses, one deduces from this table:

that if the gain has to change, that is to say if a 1 appears, either on C, or on D, the rocker $B_0$ has to change state;

that if a 1 appears on C, the rocker $B_1$ has to change state if the value of the gain at this instant is $2^2$, $2^6$ or $2^{10}$;

that if a 1 appears on D, the rocker $B_1$ has to change state if the value of the gain at this instant is $2^4$, $2^8$ or $2^{12}$;

that if C supplies a 1 and that the value of the gain at this instant is $2^6$ the rocker $B_2$ has to change state;

that if D supplies a 1 and that the value of the gain at this instant is $2^8$ the rocker $B_2$ has to change state.

These functions can be read in the description with reference to FIG. 6.

It will be observed that, if a deducting or counting order occurs when the gain is $2^{14}$ or $2^0$ respectively, no carry-over on the rockers $B_1$ and $B_2$ results therefrom. If there occurs a counting or deducting order and that the gain is $2^{14}$ or $2^0$ respectively, all the rockers $B_0$ to $B_2$ are blocked, and the gain change impulse has no effect.

Some microseconds after the third gain change impulse, an impulse is applied by the line 96 emanating from the control logic 52 on the inputs H of the store rockers 97, 98 and 99. The store rockers each have a sole preconditioning input D, each connected to the output Q of one of the rockers $B_0$, $B_1$ and $B_2$. These rockers therefore have on their respective output Q, the states of the outputs Q of the rockers $B_0$, $B_1$ and $B_2$ respectively. The store rockers preserve their state until the recording of the gain value, which takes place in the course of the treatment of the following sampe.

Although the examples given relate to gains which are multiples of two and a measurement in binary notation, the present invention is in no way restricted to the coding in this basis of notation. It is valid for any amplification chain composed of amplifiers having equal gains.

Nor is it limited by the choice of the relationship of the values of the two reference voltages, which in the example is close to the gain of one of the amplifiers of the chain. It is finally not limited by the application to a measurement amplifier using an analogue to digital converter.

The device in accordance with the invention allows the bringing to pass of a signal which takes the form of an analogue voltage sample, either in an interval of given values, or in the vicinity of one of the limits of this interval.

We claim:

1. An automatic gain ranging amplifier system comprising:

an input terminal;

a plurality of equal gain amplifier stages connected in series, with the input of the first amplifier stage in said series coupled to said input terminal;

a plurality of gates, the input of one of said gates being coupled to the input of the first amplifier stage and each of the other of said gates having an input connected to the output of a respective one of said amplifier stages;

a common output circuit coupled to the outputs of all of said gates;

a pair of sources for providing two reference voltages, the magnitude of the voltages being different and their ratio being substantially equal to said gain;

a pair of comparators each having a first input coupled to a respective one of said reference voltage sources and a second input coupled to said common output circuit;

first means coupled to the other inputs of said gates for opening only one of said gates at a time, thereby defining an output gain on said common output circuit with respect to said input terminal; and second means, coupled between said comparators and said first means, responsive to both outputs of said comparators for controlling said first means so that said gates are opened one at a time until, in the last state of said gates, a signal applied to the input terminal is amplified and coupled to the common output circuit with a value lying between the values of the reference voltages.

2. An amplifier system as defined in claim 1, comprising timing means for sequencing the operation of said second means into at least a first decision step and a last decision step which includes all of the last states of the gates; and wherein both outputs of said comparators represent that the signal at said common output, in magnitude is less than, between, or greater than said two reference voltages, and said second means responds at least at said first decision step to both outputs of said comparators for controlling said first means to increase, to maintain or to decrease said output gain, respectively.

3. An amplifier system as defined in claim 2, wherein said second means comprises means for presetting said first means to open the gate connected to the output of an amplifier stage substantially in the middle of said series-connected plurality of amplifiers before said first decision step, the possible gain change at that first decision step being at least one fourth the overall gain of said series-connected plurality of amplifier stages.

4. An amplifier system as defined in claim 3, wherein said second means comprises a bi-directional counter circuit and a logical decision means responsive to both outputs of said comparators for supplying said counter with count commands at said decision steps, the possible count change at each decision step being at least one half the one at the preceding decision step, and wherein said first means comprises a decoder circuit for said counter circuit, each decoded state of the counter having a respective gate opened.

5. An amplifier system as defined in claim 5, wherein said logical decision means is also responsive to outputs of said decoder circuit for providing gain changes equal to said equal gain at the last decision step.

6. An amplifier system as defined in claim 5, comprising a gain storage circuit connected to the output of the counter for storing the count thereof after said last decision step.

7. An amplifier system as defined in claim 6, comprising a sampler connected to said common output circuit, and responsive to said timing means for storing the signal on said common output circuit after said last decision step.

8. An amplifier system as defined in claim 7, comprising an analogue to digital converter coupled to the output of the sampler.

9. An amplifier system as defined in claim 8, comprising a recorder coupled to the analogue to digital converter and the gain storage circuit for recording output signals therefrom.

* * * * *